(12) United States Patent
Katoh et al.

(10) Patent No.: US 6,387,746 B2
(45) Date of Patent: May 14, 2002

(54) METHOD OF FABRICATING SEMICONDUCTOR LASER DIODE

(75) Inventors: Yukio Katoh; Hiroshi Wada; Keizo Takemasa, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/797,959

(22) Filed: Mar. 5, 2001

(30) Foreign Application Priority Data

Apr. 28, 2000 (JP) ........................................ 2000-129875

(51) Int. Cl.[7] .......................................... H01L 21/8234
(52) U.S. Cl. .......................................... 438/237; 438/31
(58) Field of Search ............................... 438/22, 31, 32, 438/39, 40, 43, 45, 47, 237, 525, 34, 44, 57

(56) References Cited

U.S. PATENT DOCUMENTS 5,514,619 A * 5/1996 Wakabayashi et al. ........ 438/44
5,543,353 A * 8/1996 Suzuki et al. ................ 438/331
5,659,565 A * 8/1997 Kitamura ...................... 372/43

FOREIGN PATENT DOCUMENTS

| JP | 6-260727 | 9/1994 |
| JP | 2000286508 A | * 10/2000 |

* cited by examiner

*Primary Examiner*—David Nelms
*Assistant Examiner*—Phuc T. Dang
(74) *Attorney, Agent, or Firm*—Volentine Francos, PLLC

(57) ABSTRACT

A mask layer is formed on a semiconductor substrate such that an elongate opening of the mask layer extends lengthwise at an angle relative to a [011] direction of the semiconductor substrate. A ridge waveguide structure including an active layer is formed within the elongate opening on the semiconductor substrate by a selective growth method using the mask layer as a mask. The mask layer is then removed, and a clad layer is formed over the ridge waveguide structure.

11 Claims, 2 Drawing Sheets

METHOD OF FABRICATING SEMICONDUCTOR LASER DIODE

BACKGROUND OF THE INVENTION

1. Field of the Invention

The invention relates to method of fabricating a semiconductor laser diode using selective growth.

2. Description of the Related Art

A conventional method of fabricating a semiconductor laser diode using selective growth is disclosed in Japanese patent application laid-open No. 6-260727.

According to the conventional method, strip-shaped masks for selective growth are formed on a semiconductor substrate. Then, using metal organic chemical vapor deposition (MOCVD), a lower clad layer, a multiple quantum well (MQW) active layer and an upper clad layer are formed between the selective growth masks in the stated order. With this method, not using etching, a ridge waveguide structure is fabricated.

However, according to the conventional method of fabricating a semiconductor laser diode, in a step for removing the selective growth mask, side walls of the ridge structure are exposed to the air. Although a top surface of the MQW active layer is covered with the upper clad layer, side portions of the active layer are exposed. Therefore, surface state is generated in the MQW active layer so that property of the semiconductor laser diode becomes worse.

SUMMARY OF THE INVENTION

It is therefore an object of the invention to provide a method of fabricating a semiconductor laser diode, counters against the above-described problem.

According to the present invention, such a method includes forming a mask layer on a semiconductor substrate and forming a ridge waveguide structure including an active layer on the semiconductor substrate by selective growth method using the mask layer. The mask layer is formed to be along a direction with an angle to [011] direction of the semiconductor substrate Side portions of the active layer are mostly covered with the upper grown layer so that portions of the active layer exposing to the air are relatively small. Therefore, comparing to the conventional method, it is possible to reduce the surface state of the active layer.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1A:
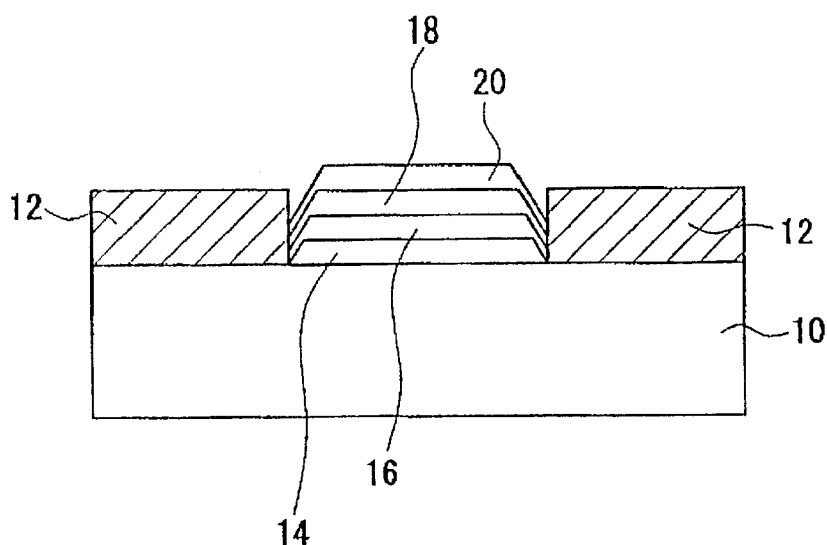
FIGS. 1(a) to 1(c) are sectional views illustrating a manufacturing process of the embodiment according to the invention.

The following will describe embodiments of the present invention with reference to the drawings. In the drawings, the size, the shape, and the mutual relationship in arrangement of each component are just roughly shown for the understanding of the present invention, so that the present invention is not limited to the exemplified embodiments.

Figure 1B:
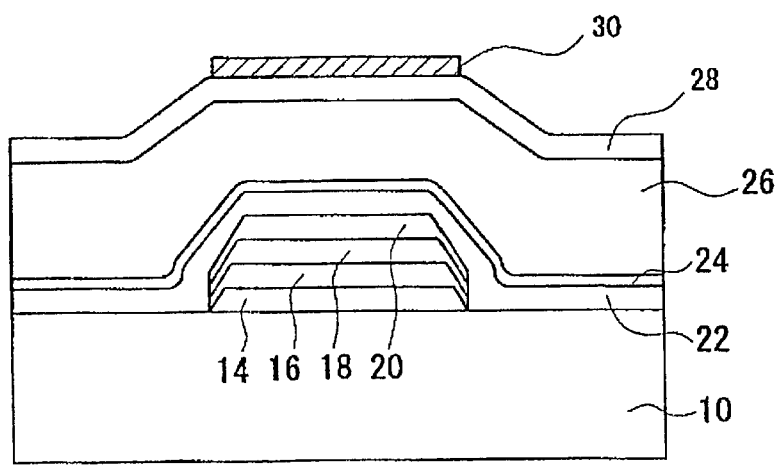
Figure 1C:
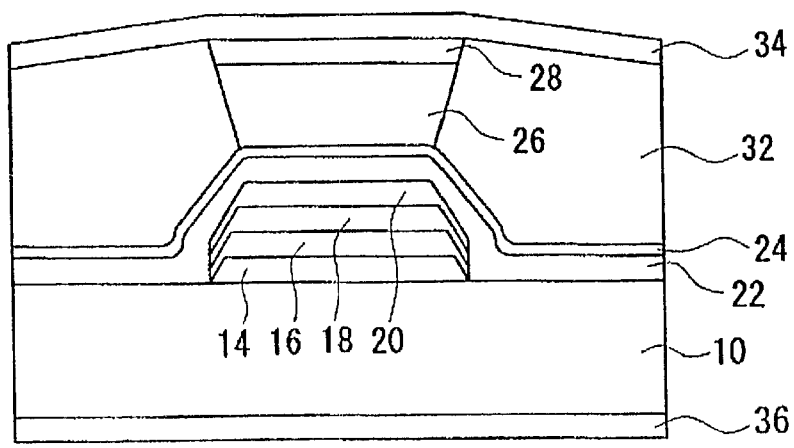
Figure 2:
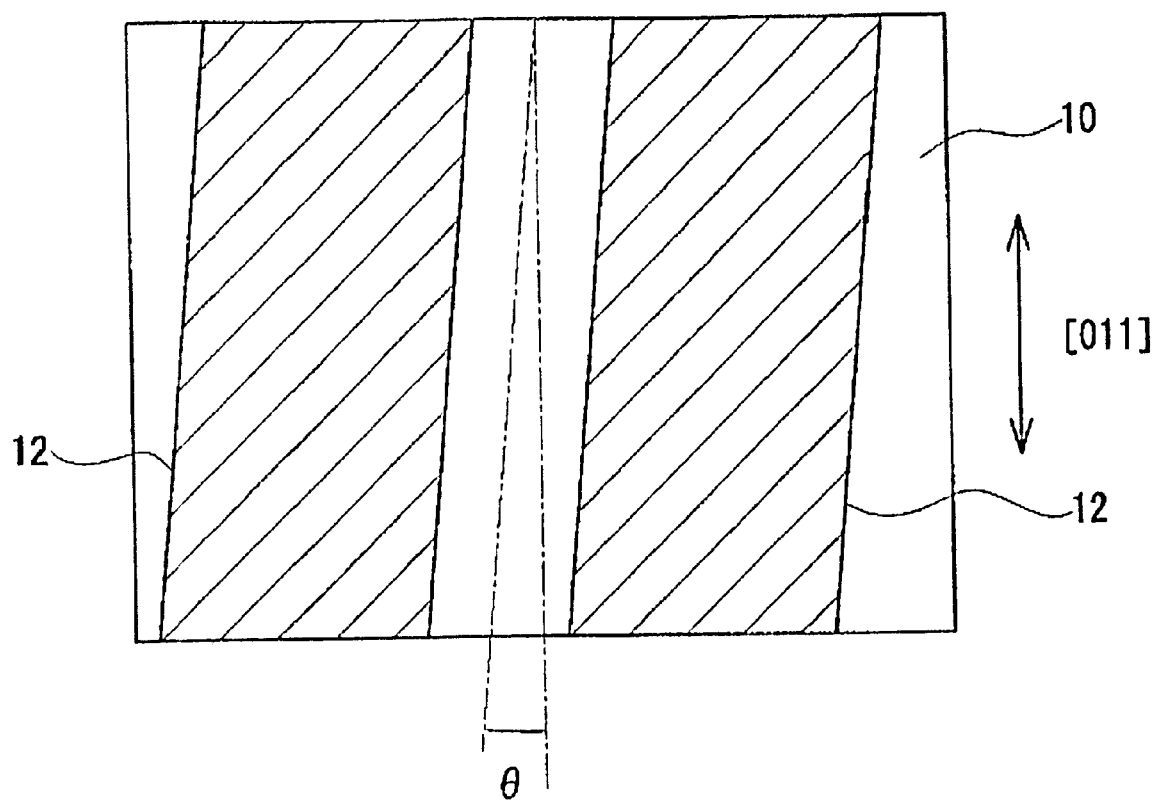
FIG. 2 is a plan view of a selective growth mask for manufacturing a semiconductor laser diode according to the invention.

With reference to FIGS. 1(a)–1(c) and FIG. 2, the embodiment of the invention is described. FIGS. 1(a) to 1(c) are sectional views illustrating a manufacturing process of the embodiment according to the invention. FIG. 2 is a plan view of a selective growth mask used for the invention.

First, as shown in FIG. 1(a), a pair of strip-shaped selective growth masks 12 are formed on an n-InP substrate 10 which has a (100) surface. An SiO2 film is patterned by conventional photolithography so as to form the selective growth masks 12. For example, the thickness of the selective growth masks 12 is 0.2 $\mu$m and the masks 12 are formed with 2 $\mu$m interval.

As shown in FIG. 2, the selective growth masks 12 are formed to be along a direction with an angle $\theta$ to [011] direction. Therefore, a laser resonator is formed along the direction with the angle $\theta$ to [011] direction. The angle $\theta$ is, for example, 5 degrees.

Consequently, in a gap between the selective growth masks 12, an InGaAsP optical confinement layer 14 (600 Å), an MQW active layer 16, an InGaAsP optical confinement layer 18 (600 Å) and a p-InP layer 20 (500 Å) are formed by MOCVD in the stated order. The MQW active layer includes, for example, five layers of InGaAsP well and a layer of InGaAsP barrier. As a result, a ridge waveguide structure including an active layer is formed.

As described above, using the selective growth mask formed along the direction with the angle $\theta$ to [011] direction, each layer grows to cover the under layer as shown in FIG. 1(a).

Consequently, the selective growth masks 12 are removed. In this step, the ridge waveguide structure including the MQW active layer 16 is exposed to the air. Because side portions of the MQW active layer 16 are mostly covered with the upper optical confinement layer 18, exposed portions of the MQW active layer are relatively small. Therefore, comparing to the conventional method, it is possible to reduce the surface state of the MQW active layer 16.

Then, as shown in FIG. 1(b), on the whole surface, p-InP clad layer 22 (500 Å), p-InGaAsP etching stopper layer 24 (200 Å), p-InP clad layer 26 (3 $\mu$m), p-InGaAs contact layer 28 (0.2 $\mu$m) are formed by MOCVD in the stated order.

Consequently, an etching mask 30 is formed on the contact layer 28. An SiO2 film is patterned by conventional photolithography so as to form the etching masks 30. For example, the thickness of the etching masks 12 is 0.2 $\mu$m.

Consequently, using the etching mask 30 as a mask, p-InGaAs contact layer 28 and the p-InP clad layer 26 are etched. This etching is, for example, wet etching using etchant including chlorine. According to the etching, a reverse mesa including the contact layer 28 and the p-InP clad layer 26 are formed on the ridge waveguide structure including the MQW active layer 18.

Then, as shown in FIG. 1(c), after removing the etching mask 30, polyimide layers 32 are formed on both side of the reverse mesa. Consequently, a P-type electrode 34 consisting of Au and Zn is formed on the contact layer 28. Also, an N-type electrode 36 consisting of Au, Ge and Ni is formed on the back surface of the substrate 10. According to the above-described steps, a semiconductor laser diode is manufactured.

According to the invention, the selective growth masks are formed to be along the direction with the angle $\theta$ to [011] direction. Using this selective growth masks, each layer grows to cover the under layer one after the other. Therefore, side portions of the active layer are mostly covered with the upper grown layer so that portions of the active layer exposing to the air are relatively small. As a result, comparing to the conventional method, it is possible to reduce the surface state of the active layer.

What is claimed is:

1. A method of fabricating a semiconductor laser diode, comprising:

forming a patterned mask layer on a semiconductor substrate, said mask layer having an elongate opening which extends lengthwise at an angle relative to a [011] direction of said semiconductor substrate;

selectively growing a waveguide structure having an active layer on said semiconductor substrate and within said elongate opening of said mask layer using said mask layer is used as a mask;

removing said mask layer; and forming a clad layer over said ridge waveguide structure.

2. The method of claim 1, wherein said mask layer is formed on a (100) surface of said semiconductor substrate.

3. The method of claim 2, wherein said selective growth method is a metal organic vapor deposition method.

4. The method of claim 1, wherein said active layer is a multiple quantum well layer.

5. A method of fabricating a semiconductor laser diode, comprising:

forming a pair of strip-shaped mask layers on a semiconductor substrate, said mask layers defining an elongate opening therebetween which extends lengthwise at an angle relative to a [011] direction of said semiconductor substrate;

selectively growing a waveguide structure having an active layer on said semiconductor substrate and within said elongate opening of said mask layers using said mask layers used as a mask;

removing said mask layers; and forming a clad layer over said ridge waveguide structure after removing said mask layers.

6. A method of fabricating a semiconductor laser diode, comprising:

forming a patterned mask layer on a semiconductor substrate, said mask layer having an elongate opening which extends lengthwise at an angle relative to a [011] direction of said semiconductor substrate, said mask layer further having opposing sidewalls extending along respectively opposite sides of said elongate opening;

selectively growing a waveguide structure having an active layer on said semiconductor substrate and within said elongate opening of said mask layer using said mask layer as a mask, said waveguide structure further having opposite sidewalls which respectively contact said opposing sidewalls of said mask layer;

removing said mask layer to expose said opposite sidewalls of said waveguide structure; and forming a clad layer over said waveguide structure after removing said mask layer.

7. The method of claim 6, wherein said waveguide structure is formed having an upper surface which tapers downward on opposite sides in a direction towards said semiconductor substrate, and wherein said opposite sides of said upper surface of said waveguide structure respectively terminate at said opposing sidewalls of said mask layer.

8. The method of claim 7, wherein said waveguide structure includes at least a first confinement layer formed over said semiconductor substrate, said active layer formed over said first confinement layer, and a second confinement layer formed over said active layer, and wherein opposite sides of an upper surface of each of said active layer and said first and second confinement layers taper downward in a direction towards said semiconductor substrate so as to respectively terminate at said opposing walls of said mask layer.

9. The method of claim 1, wherein said active layer is a multiple quantum well layer.

10. The method of claim 6, wherein said mask layer is formed on a (100) surface of said semiconductor substrate.

11. The method of claim 6, wherein said selective growth method is metal organic vapor deposition method.

* * * * *